(12) United States Patent
Ishibashi

(10) Patent No.: US 6,375,756 B1
(45) Date of Patent: Apr. 23, 2002

(54) METHOD FOR REMOVING A DEPOSITED FILM

(75) Inventor: Keiji Ishibashi, Tokyo (JP)

(73) Assignees: ANELVA Corporation; Japan Science and Technology Corp., both of (JP)

(*) Notice: Subject to any disclaimer, the term of this patent is extended or adjusted under 35 U.S.C. 154(b) by 90 days.

(21) Appl. No.: 09/633,013

(22) Filed: Aug. 4, 2000

(30) Foreign Application Priority Data

Aug. 5, 1999 (JP) .............................................. 11-222087

(51) Int. Cl.[7] .............................. B08B 7/00; B08B 9/00
(52) U.S. Cl. ..................... 134/19; 134/22.1; 134/1.3; 438/905; 156/345
(58) Field of Search .......................... 134/1.1, 1.2, 1.3, 134/21, 22.1, 19; 438/905; 156/345

(56) References Cited

U.S. PATENT DOCUMENTS 5,849,092 A * 12/1998 Xi et al. ....................... 134/1.1
5,926,743 A * 7/1999 Xi et al. ....................... 134/1.1
6,143,128 A * 11/2000 Ameen et al. ............... 118/719
6,201,219 B1 * 3/2001 Sandhu et al. ............... 118/724
6,242,347 B1 * 6/2001 Vasudev et al. ............. 438/680
6,255,222 B1 * 7/2001 Xia et al. ..................... 134/1.1

FOREIGN PATENT DOCUMENTS

| JP | 08-241865 A | 9/1996 |
| JP | 09-045623 A | 2/1997 |
| JP | 10-083988 A | 3/1998 |
| JP | 11-054441 A | 2/1999 |

* cited by examiner

Primary Examiner—Randy Gulakowski
Assistant Examiner—S. Chaudhry
(74) Attorney, Agent, or Firm—Baker & Daniels

(57) ABSTRACT

A method for efficiently and completely removing a film deposited inside a film forming chamber and an in-situ cleaning method of a hot element CVD apparatus. A hot element is disposed in a chamber is heated up to a temperature of 2000° C. or higher after the chamber is exhausted. Thereafter a cleaning gas which is decomposed and/or activated by the hot element to generate an activated species that converts the deposited film into gaseous substance is introduced into the chamber.

12 Claims, 1 Drawing Sheet

METHOD FOR REMOVING A DEPOSITED FILM

FIELD OF THE INVENTION

This invention relates to a method for removing a deposited film and in particular to an in-situ cleaning method of a hot element CVD apparatus wherein a film is formed with the aid of a hot element set at a prescribed high temperature.

BACKGROUND OF THE INVENTION

In the manufacturing process of semiconductor devices such as an LSI (large scale integrated circuit), display devices such as an LCD (liquid crystal display) and the like, a chemical vapor deposition (CVD) method is widely used for forming a variety of thin films on a substrate.

As such a CVD method, a plasma CVD method which utilizes a plasma to decompose and/or activate a material gas to form a film on a substrate and a thermal CVD method which utilizes the heat of a substrate to cause a reaction of a material gas and form a film on a substrate are well known. In addition to these methods, there is another CVD method in which a material gas is decomposed and/or activated to form a film by a hot element set at a prescribed high temperature. This CVD method is called "a hot element CVD method" hereinafter.

A CVD apparatus to carry out this method is constructed so that a hot element made of metal having a high melting point such as tungsten and a substrate are disposed in a processing vacuum chamber, and a material gas is introduced into the chamber while the hot element is maintained at a temperature of about 1000–1800° C. The material gas introduced in the chamber is decomposed and/or activated to generate activated species when passing over the surface of the hot element. The activated species reaches the substrate and forms a thin film on the surface of the substrate. Of such a hot element CVD method, one using a wire as a hot element is referred to as a Hot-Wire CVD method, and one that is thought to be utilizing the catalytic reaction of a hot element in decomposition or activation process of the material gas is referred to as a Catalytic-CVD (or Cat-CVD) method.

In the hot element CVD method, the decomposition or activation reaction of the material gas occurs when the gas passes over the surface of the hot element. Therefore, the substrate temperature can be lowered as compared with a thermal CVD method in which such a reaction is caused to occur only by the heat of the substrate. And unlike a plasma CVD method, the substrate is free from the damages caused by plasma. For these reasons, the hot element CVD method is expected to be a promising film forming method of semiconductor devices and display devices of the next generation, which will have higher integration and higher functions.

As the film formation is made on a substrate, a film is also deposited on the inner structures of the film forming apparatus in any film forming method including CVD methods mentioned above. The film deposited on the inner structures peels off when it becomes thick, which produces particles. The particles thus produced may be incorporated in the film on the substrate or adhere to the surface of the film, which causes the defect in the device and reduces production yield of the device.

In order to avoid these problems, the deposited film on the inner structures should be periodically removed before peeling off in the repetition of film formation.

One method often used for preventing the generation of particles due to the peeling-off of the deposited film is to cover the inner surfaces of the apparatus with sheets or members on which the films will be deposited instead of on surfaces of the apparatus and to periodically exchange these sheets or members. However, since the deposition takes place even inside the narrow gaps of inner structure or on the hidden side of the sheets or members in the case of, e.g., the CVD apparatus. It is impossible to completely prevent the generation of particles.

In contrast, as a method for removing a film deposited inside the film forming chamber, there is a method called an in-situ cleaning method in which a cleaning gas is introduced into the chamber and is made to react with deposited films with the aid of energy of plasma or heat to generate gaseous substances which can be exhausted.

Since the in-situ cleaning method is carried out without exposing the inside of the chamber to the atmosphere, the continuous and stable production of thin films having a prescribed characteristic becomes available. In addition, since neither the exchange of the sheets or members nor the operation of exhausting the chamber from the atmospheric pressure to a prescribed pressure is necessary, the time for the cleaning process is remarkably shortened. Thus, this method has an advantage in increasing the productivity.

Moreover, this method makes it possible to remove even the film deposited inside the narrow gaps and effectively suppress the generation of particles.

When the in-situ cleaning method is applied to a plasma CVD apparatus used for forming, for example, a silicon film or a silicon nitride film, a cleaning gas such as $NF_3$, $CF_4$ or $CCl_4$ is introduced into the processing chamber and the plasma is generated at a proper time after the film formation has been repeatedly carried out. The cleaning gas is decomposed and/or activated by the plasma to react with a deposited film. A silicon film is converted to silicon tetrafluoride ($SiF_4$) or silicon tetrachloride ($SiCl_4$) and a silicon nitride film to $SiF_4$ or $SiCl_4$ and nitrogen ($N_2$). Since these gaseous substances are to be exhausted, the deposited film, consequently, can be removed.

In contrast, when a cleaning gas such as $ClF_3$ that is easily decomposed by heat is employed, plasma is not necessary. The deposited film can also be converted to gaseous substances merely by heating the chamber. However, the chamber must be heated above 200° C. in order to obtain a practical removal rate, which may cause the degradation of vacuum seals and substantially lengthens the cleaning time because it takes a long time to heat and cool the chamber.

As has been mentioned, the in-situ cleaning of the film forming chamber is a very important process that is used to stabilize and continuously form a film with prescribed characteristics. Therefore, the present inventor attempted to apply the in-situ cleaning method to a promising hot element CVD apparatus and found that the conventional in-situ cleaning methods have a problem in that a hot element itself reacts with the cleaning gas, and the wire becomes thin. That is, in this attempt, there were placed electrodes for the plasma generation in the processing chamber, the cleaning gas was introduced and then plasma was generated to carry out the cleaning. Although the deposited film could be removed, the hot element was also etched so that its diameter decreases. As a result, the prescribed exothermic characteristics could not be obtained in the next film formation.

A $ClF_3$ gas as a cleaning gas was introduced into the film forming chamber which was heated to 200° C. by using a heater installed outside. The hot element similarly reacted with the cleaning gas and its diameter decreased.

Thus, conventional in-situ cleaning methods cannot be directly applied to a hot element CVD apparatus. However, since in-situ cleaning is desired for the continuous and stable production of films, further examinations on the cleaning condition were made to establish if in-situ cleaning technology is applicable to the hot element CVD apparatus.

As the part of the examinations of various cleaning conditions, the inventor made cleaning treatments by setting a hot element at various temperatures. As a result of these experiments, it was found that the reaction of the hot element with the cleaning gas was accelerated with the increase in its temperature, but that the reaction was suppressed at an extremely high temperature. The detail of the reason why this unique phenomenon occurred is not clear at the present; however, it is likely the temperature of the hot element is so high that the period for which the cleaning gas can stay adhering to the hot element surface is much shorter than the period necessary to complete the reaction with the hot element.

In addition, it was also found that the deposited film adhering to the inside of the processing vacuum chamber could be efficiently removed even in the case where the plasma is not generated, by setting the temperature of the hot element above a certain value.

SUMMARY OF THE INVENTION

This invention has been completed for the first time based on the above-mentioned knowledge and discovery. An object of this invention is to provide a method for efficiently and completely removing a film deposited even on the surface of a member having a complicated shape without providing a heating means for heating the member.

Another object of this invention is to provide an in-situ cleaning method for a hot element CVD apparatus, which enables removal of a film deposited inside the apparatus without exposing the inside of the apparatus to the atmosphere.

As mentioned, this invention has been accomplished as a result of close examinations to attain the above-mentioned objects. That is, a method for removing a deposited film of this invention comprises a method for removing a film deposited inside a chamber which can be exhausted and/or on a member placed in said chamber, wherein a hot element disposed in said chamber is heated up to a temperature of 2000° C. or higher after said chamber is exhausted, and thereafter a cleaning gas which is decomposed and/or activated by said hot element to generate an activated species that converts said film into gaseous substance is introduced into said chamber.

And said chamber is of a CVD apparatus which decomposes and/or activates a material gas by said hot element and deposit a film containing at least one element of said material gas on a substrate.

By setting a hot element at a high temperature above 2000° C., it becomes possible to suppress the corrosion of the hot element due to the reaction with a cleaning gas to the practical use level. Moreover, a hot element set above 2000° C. seems to efficiently decompose and/or activate the cleaning gas and generate activated species, which makes it possible to effectively remove films deposited inside the chamber. And the activated species thus generated seems to have such a long lifetime that even films deposited on a complicated shape or the inside of the pipe can be removed. Therefore, merely by the installation of a gas supply system of the cleaning gas to a conventional hot element CVD apparatus, it becomes possible to carry out the in-situ cleaning which is inevitable for the continuous formation of films with high characteristics.

This invention is also characterized in that at least a part of the surface of the inner structure of the chamber is covered with platinum.

The inner structures except, for the hot element, are corroded by the cleaning gas during the cleaning process since their temperature does not reach 2000° C. However, the corrosion of the inner structures does not influence the film forming performance or the removal performance of deposited films since these structures are generally very thick compared with the hot element. Nevertheless, if the performance of the inner structures such as a measurement element, a sensor and the like is deteriorated by the contact of the cleaning gas, it is desirable to cover the part with platinum to cut off the contact with the cleaning gas. A current lead member, for example, may also be covered with platinum when a thin rod is used therefor.

In this invention, said cleaning gas comprises fluorine ($F_2$), chlorine ($Cl_2$), nitrogen trifluoride ($NF_3$), carbon tetrafluoride ($CCF_4$), hexafluoroethane ($C_2F_6$), octafluoropropane ($C_3F_8$), carbon tetrachloride ($CCl_4$), pentafluorochloroethane ($C_2ClF_5$), trifluorochlorine ($ClF_3$), trifluorochloromethane ($CClF_3$), sulfur hexafluoride ($SF_6$) or mixtures thereof.

These gases are sufficiently decomposed and/or activated with the aid of a hot element set at a temperature above 2000° C., and convert the deposited films to gaseous substances, resulting in efficiently removing the deposited film.

It is preferable in this invention to employ a hot element made of tungsten, tantalum, niobium, carbon, osmium, iridium, molybdenum or ruthenium, or an alloy or a composite thereof.

These metals, alloys or composites efficiently activate and/or decompose the cleaning gas at a temperature above 2000° C. to generate the activated species having a long lifetime and a high reactivity with a film. Consequently, effective removal of deposited films is attained.

DESCRIPTION OF THE PREFERRED EMBODIMENTS

Figure 1:
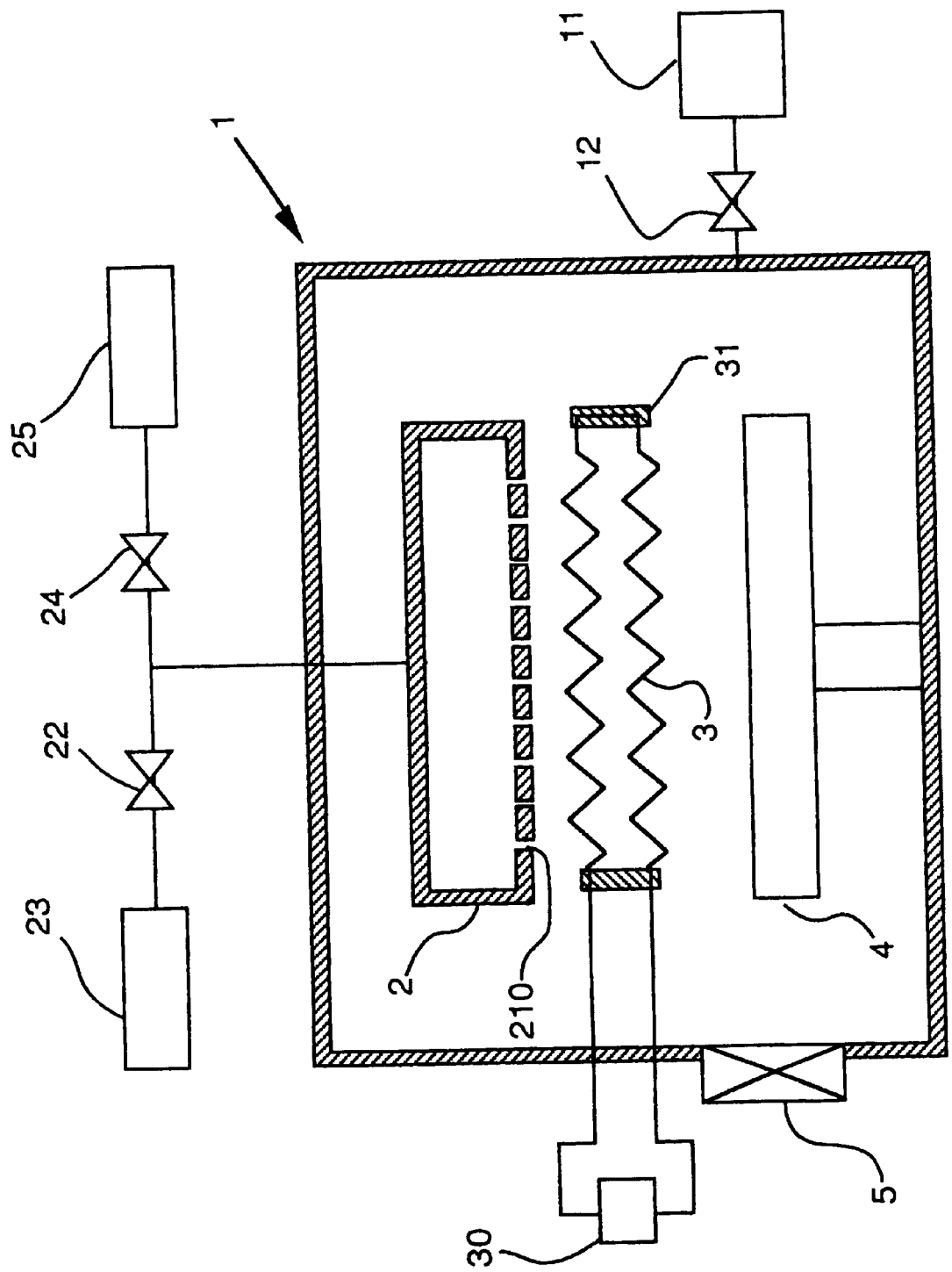
FIG. 1 is a diagrammatic representation of a film forming apparatus employing a hot element CVD in situ cleaning method.

The preferred embodiments of this invention will be described below by referring to the accompanying drawing.

The embodiments disclosed below are not intended to be exhaustive or to limit the invention to the precise forms disclosed in the following detailed description. Rather, the embodiments are chosen and described so that others skilled in the art may utilize their teachings.

A film forming apparatus shown in FIG. 1 is composed of a processing vacuum chamber 1, an exhaust system 11 for exhausting the processing vacuum chamber 1, gas supplying systems 23,25 for supplying a material gas for the film formation and a cleaning gas, and a gate valve 5 through which a substrate is transferred. In the processing vacuum chamber 1, a gas supply vessel 2 connected with gas supply system 23,25, a substrate holder 4, and a hot element 3 are installed.

The introduction of a material gas and a cleaning gas to gas supply vessel 2 is switched by valves 22,24. The feed rate of these gases is controlled by a respective flow controller (not illustrated) provided in each of gas supply systems 23, 25. Gas supply vessel 2 has a hollow structure and a plurality of gas outlets 210 in the plane that faces to substrate holder 4. The exhaust systems 11 are connected to processing vacuum chamber 1 through a main valve 12 having an exhaust speed regulation function by which the pressure inside the processing chamber is controlled.

A support member 31 holds hot element 3 that is connected to an energy supply mechanism 30 for controlling the temperature of hot element 3. The hot element is heated and maintained at a high temperature to decompose and/or activate a material gas during a film formation process and a cleaning gas during a cleaning process, which brings about efficient film formation and cleaning.

Next the method of the film formation and the cleaning will be explained by using the apparatus shown in FIG. 1.

First, a substrate is transferred into processing vacuum chamber 1 through gate valve 5 from a load lock chamber (not illustrated) and is placed on substrate holder 4. After processing vacuum chamber 1 is evacuated to a prescribed pressure by exhaust system 11, energy is supplied to hot element 3 from energy supply mechanism 30 to maintain hot element at a prescribed temperature. The temperature of 1000–1800° C. is usually used, depending on the type of a film to be formed and the material gas.

Then, valve 22 is opened and the material gas is introduced into the processing vacuum chamber at a prescribed flow rate. The pressure inside the processing vacuum chamber is set at a prescribed pressure by the exhaust speed regulation function of main valve 12. The material gas may be selected according to a film to be formed; for example, silane ($SiH_4$) and hydrogen ($H_2$) are employed for forming a silicon film, $SiH_4$, $H_2$ and ammonia ($NH_3$) for a silicon nitride film, and $SiH_4$, $H_2$ and methane ($CH_4$) for a silicon carbide film.

The material gas supplied into gas supply vessel 2 is blown off through gas outlets 210 in the direction of hot element 3, and is decomposed and/or activated by the high-temperature hot element to generate activated species. The activated species reaches the substrate and the film is deposited on it. When the thickness of the film on the substrate comes to a predetermined value, the material gas and the energy to the hot element is cut off. After the chamber is evacuated, the substrate is carried to the load lock chamber through gate valve 5 to finish the film formation.

The repetitions of the film formation mentioned above also make the film deposited on the inner surface of the processing vacuum chamber, the substrate holder, the gas supply vessel, the support member and the like. When this deposited film is thickened, it will peel off to produce particles. The particles may be entrapped in the film during the film formation or may adhere to the surface of the film, which deteriorates the characteristics of the film or causes defects in devices. Therefore, the following cleaning treatment is performed before the film become so thick to peel off and generate particles. The film thickness of a deposited film may be monitored with the aid of an optical sensor or be estimated from the total film forming time.

In the cleaning process, the processing vacuum chamber is evacuated at first, and the hot element is heated up to some temperature above 2000° C. and maintained at the temperature by the energy from energy supply mechanism 30. Next, valve 24 is opened and the cleaning gas is introduced into processing vacuum chamber 1. The pressure is set at a prescribed pressure by main valve 12.

The gas ejected from gas outlets 210 is effectively decomposed and/or activated by the hot element maintained at a temperature of 2000° C. or higher to generate highly-reactive activated species. The activated species reacts with the film deposited on the surface of the inner wall, the substrate holder and the like and converts them into gaseous substances. The films which are gradually converted into gaseous substances are evacuated outside by the exhaust system.

This condition is maintained until the deposited films are completely removed. Thereafter, valve 24 is closed to stop supplying the cleaning gas and the processing vacuum chamber is evacuated. Finally, the energy supply to the hot element is cut off.

The cleaning process is completed in this way. It is important in the cleaning process that the temperature of the hot element be maintained at 2000° C. or higher when the cleaning gas is introduced. If the cleaning gas is introduced before hot element 3 is heated to 2000° C., the hot element is made to react with the cleaning gas until heated up to 2000° C. which causes corrosion and decreases, e.g., the diameter of, the hot element.

This is also the case when the energy supply to the hot element is stopped. That is, the temperature of the hot element must be lowered after the cleaning gas is exhausted. In other words, the hot element must not be in contact with the reactive cleaning gas at the temperature lower than 2000° C.

It is also preferable that the partial pressure of oxygen in the processing vacuum chamber should be as low as possible from the viewpoint of the lifetime of hot element since the hot element is in the state to be easily oxidized.

Hot element 3 is usually connected and fixed to current lead members (not illustrated) installed in the processing vacuum chamber. The current lead members are usually made of Mo or Cu and formed in rod or block shape. The electric current is applied to the hot element through current lead members from energy supply mechanism 30. The members also react with the cleaning gas and are etched, since the temperature of the current lead members rises little. However, this reaction will not influence at all the exothermic characteristic of the hot element since their cross sections are very large compared with that of the hot element.

Nevertheless, it may be possible to cover the surface of the current lead members with platinum to prevent the reaction with the cleaning gas. In this case, the coating of platinum is made by a method of electron-beam evaporation, sputtering, plating, lining, or the like.

The in-situ cleaning method of a hot element CVD apparatus has been described so far. The cleaning method of this invention is also available in the case of removing films deposited in other processing apparatuses or films deposited on various members. Here, the term "members" is meant to include a measuring instrument, a sensor, a valve and the like usually used in vacuum apparatuses.

Films adhered to the inside of a vacuum vessel, for example, are removed in the following way. A hot element is installed in the vacuum vessel so that the element can be activated from outside. A cleaning gas inlet port is also provided to the vacuum vessel. A deposited film can be removed by heating the element over 2000° C. and then introducing the cleaning gas into the vacuum vessel.

In the case of removing films deposited on members, the members are placed in such a vacuum vessel, and similar treatment is carried out. In the case of pipe with a considerable length, a hot element is placed at the upstream end of the pipe so that the gas is made flow inside the pipe. It is also possible to construct a vacuum vessel with pipes or members to be treated.

Even films deposited in narrow gaps of a member with complicated shapes or inside the pipe can be effectively removed by this invention as has been mentioned. This seems to be attributed to the activated species of cleaning gas which is generated to be very reactive by a hot element maintained at 2000° C. or higher and to have a considerably long lifetime.

The removal method of deposited film of this invention can be applied to various types of deposited films by appropriately selecting a cleaning gas and a cleaning condition. For example, when a cleaning gas containing fluorine or chlorine are used, various types of deposited films including metal films such as W, Ta and Ti can also be removed as well as semiconductors or insulators such as silicon, silicon carbide, and silicon nitride.

As a hot element, any material can be used so long as it may stay stable at a temperature higher than 2000° C. In particular, tungsten, tantalum, niobium, carbon, osmium, iridium, molybdenum or ruthenium is preferably employed. Alloys made of these metal are also preferably employed. In addition, composites that have a multiplayer structure of the metal or the alloy are also used. For example, the metal such as tungsten that becomes fragile once heated to high temperature is preferably used in a composite structure with another metal or alloy. The composites of the metal or the alloy with an insulator are also available. The hot element is used in a variety of shapes such as a wire, rod, plate, tube, foil or the like. A wire may be further formed into coil or saw tooth shape.

A cleaning gas is also selected according to the type of deposited film, the cleaning condition, or materials of the processing vacuum chamber. A fluorine- or chlorine-containing gas is suitably used. In particular, $NF_3$, $F_2$, $Cl_2$, $CF_4$, $C_2F_6$, $C_3F_8$, $CCl_4$, $C_2ClF_3$, $ClF^3$, $CClF_3$ or $SF_6$ is preferably used. The gas can be diluted by, e.g., Ar or He, or can be mixed for practical use.

In addition, a conventional plasma cleaning may be simultaneously carried out in the method of this invention, by installing an electrode for the plasma generation in processing vacuum chamber 1.

The present invention will be more concretely explained below, citing a practical embodiment. It should be, however, understood that this invention is not limited to this embodiment.

First a silicon film was repeatedly formed by the method previously mentioned. Then, the film deposited on the inner surface of processing vacuum chamber was removed as follows.

A hot element CVD apparatus as shown in FIG. 1 was employed to form the silicon film. Here, silane ($SiH_4$) and hydrogen ($H_2$) were used as a material gas, and a tungsten wire of 0.5 mm in diameter used as a hot element 3 was connected to a DC power source used as energy supply mechanism 30. A direct current of about 13 A were applied to the tungsten wire from the DC power source to heat up to about 1800° C. Such a film formation was repeated until the silicon film of about 2 $\mu$m in thickness deposited on the inner surface of processing vacuum chamber 1.

After the last substrate was taken out through gate valve 5, main valve 11 was fully opened to evacuate processing vacuum chamber 1. Then, a direct current of 22A was applied to the tungsten wire to heat up to about 2500° C. Valve 24 was opened to introduce the $NF_3$ gas into processing vacuum chamber 1 from cleaning gas supply system 25 through gas supply vessel 2. The pressure in processing vacuum chamber 1 was adjusted at 40 Pa by the exhaust speed regulator of main valve 12. This state was maintained for 10 minutes to remove deposited films in processing vacuum chamber 1. Then, valve 24 was closed to stop the cleaning gas and main valve 12 was fully opened to evacuate processing vacuum chamber 1. Finally, the power supply to the hot element was stopped.

The processing vacuum chamber was opened to the atmosphere and the tungsten wire was taken out for inspection. No change in the diameter of the tungsten wire was detected between before and after the cleaning from the measurements taken with a micrometer. It was also found from close examination of the inner wall and inner structures that deposited films were completely removed.

The reasons why the silicon film deposited inside the processing vacuum chamber was perfectly removed, and the tungsten wire did not change during the cleaning may be explained in the following.

The fact that the deposited silicon films were removed seems to be explained as follows. $NF_3$ gas is inherently decomposed and/or activated around 400° C. Therefore, introduced $NF_3$ gas is sufficiently decomposed and/or activated by the tungsten wire maintained at a temperature of 2500° C. much higher than the temperature at which the decomposition or activation starts to occur. Fluorine thus generated reacts with the silicon film deposited inside the processing vacuum chamber to produce silicon tetrafluoride ($SiF_4$) that is a gaseous substance at ordinary temperature and therefore can be exhausted.

Utilizing this reaction, the silicon film deposited inside the processing chamber can be removed by exhaustion of $SiF_4$. And fluorine thus generated seems to have a lifetime long enough to spread into the narrow gaps and react with deposited film to produce $SiF_4$. Accordingly, even films deposited inside narrow gaps can be completely removed.

Next, the fact that the tungsten wire of hot element was stable during the cleaning treatment may be explained as follows. Tungsten usually reacts with fluorine and produce tungsten hexafluoride ($WF_6$) that is a gaseous substance at ordinary temperature. If this reaction occurs, the tungsten wire will be etched together with deposited silicon film and therefore will be thinned. But, as a matter of fact, the reaction did not take place when the tungsten wire was made at a temperature of 2500° C. Accordingly, it is likely from these facts that fluorine could not stay at the surface of the hot element for the period required to complete the reaction of fluorine with the heating when the hot element is maintained at an extremely high temperature.

The high performance of the removal method of this embodiment was also confirmed from an experiment using a silicon wafer. That is, in this experiment, a silicon wafer was placed 15 cm away from the hot element and the same cleaning treatment as that for the deposited film was carried out. As a result, even the crystal silicon was etched of 2 $\mu$m in 10 minutes, meaning that the method of this embodiment has excellent efficiency in removing deposited films.

Next, the film formation and the cleaning treatment were carried out in the same way as in the above embodiment, except that the hot element was set at 2000° C. during the cleaning treatment. Silicon films deposited inside the chamber were also completely removed within 10 minutes. Although a little change was seen on the appearance of the tungsten wire at its contact part with support member 31, no change in the wire diameter was observed by the measurement with a micrometer. Thus, it is apparent that the deposited films can be removed without problems in practical use by heating the wire up to 2000° C.

The cleaning treatment was carried out at a pressure of 40 Pa in the above embodiment. But there is no particular restriction on the pressure of the cleaning gas. That is, any pressure lower or higher than 40 Pa can be used. Thus, unlike the plasma cleaning method wherein the pressure is restricted in some range to cause stable plasma discharge, the method of the present invention can select an appropriate pressure from the viewpoint of practical use, depending on the type of the deposited film, and the material used to construct a processing vacuum chamber or members, and their shapes.

And as an energy supply mechanism 30, an AC power source can also be used instead of a DC power source.

Although the temperature of the objects to be treated such as the inner wall of processing chamber 1, substrate holder 4, and gas supply vessel 2 has not been mentioned in the above embodiment, these objects may be heated by a heater to increase the removal rate of deposited films and shorten the cleaning time, since the higher the temperature of these objects, the larger the reaction rate of the cleaning gas with deposited films.

On the other hand, deposited films can be removed without heating in such a short time as previously mentioned so that whether the objects are heated or not is a matter of choice of the cleaning condition.

Moreover, in the conventional method using a gas such as ClF$_3$, a processing vacuum chamber must be heated in order to obtain practical removal rate of deposited films. However the heating treatment is not necessary in this invention, so that heating and cooling time of processing vacuum chamber which usually needs a long time can be left out and therefore the substantial cleaning time can be remarkably shortened.

The present invention makes it possible to provide a method for effectively removing films deposited inside various film forming chambers and on the members by setting the hot element at a temperature of 2000° C. or higher, and then introducing a cleaning gas.

In addition, the in-situ cleaning of a hot element CVD apparatus is realized. As a result a continuous production of thin films having high characteristics becomes available by a hot element CVD method which is expected to be a promising manufacturing means for producing high characteristic films.

Thus, the present invention contributes to further improvement of the characteristics and productivity of semiconductor devices and display devices, and also promotes their development.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method for removing a film deposited inside a chamber, said method comprising:

providing a hot element in a said chamber;

exhausting the chamber;

heating the hot element up to a temperature of 2000° C. or higher after said chamber is exhausted;

thereafter supplying a cleaning gas into the chamber, so that the cleaning gas is one of decomposed and activated by said hot element to generate an activated species that converts said deposited film into a gaseous substance; and removing the gaseous substance from the chamber.

2. The method according to claim 1, wherein said chamber comprises a CVD apparatus and the method further comprises:

heating the hot element;

supplying a material gas to the chamber;

contacting the material gas with the hot element to cause one of decomposition and activation of the material gas by said hot element; and forming a deposited film on a substrate which comprises at least one element from said material gas.

3. The method according to claim 2, wherein at least a part of a surface of an inner structure of said chamber is covered with platinum.

4. The method according to claim 2, wherein said cleaning gas is a gas containing at least one of fluorine ($F_2$), chlorine ($Cl_2$), nitrogen trifluoride ($NF_3$), carbon tetrafluoride ($CF_4$), hexafluoroethane ($C_2F_6$), octafluoropropane ($C_3F_8$), carbon tetrachloride ($CCl_4$), pentafluorochloroethane ($C_2ClF_5$), trifluorochlorine ($ClF_3$), trifluorochloromethane ($CClF_3$), sulfur hexafluoride ($SF_6$) or mixtures thereof.

5. The method according to claim 2, wherein said hot element comprises a metal, alloy, or composite.

6. The method according to claim 5, wherein the hot element comprises at least one element selected from the group consisting of tungsten, tantalum, niobium, carbon, osmium, iridium, molybdenum or ruthenium.

7. The method according to claim 2, wherein the deposited film is deposited on an inner surface structure of the chamber.

8. The method according to claim 1, wherein at least a part of a surface of an inner structure of said chamber is covered with platinum.

9. The method according to claim 1, wherein said cleaning gas is a gas containing at least one of fluorine ($F_2$), chlorine ($Cl_2$), nitrogen trifluoride ($NF_3$), carbon tetrafluoride ($CF_4$), hexafluoroethane ($C_2F_6$), octafluoropropane ($C_3F_8$), carbon tetrachloride ($CCl_4$), pentafluorochloroethane ($C_2ClF_5$), trifluorochlorine ($ClF_3$), trifluorochloromethane ($CClF_3$), sulfur hexafluoride ($SF_6$) or mixtures thereof.

10. The method according to claim 1, wherein said hot element comprises a metal, alloy, or composite.

11. The method according to claim 10, wherein the hot element comprises at least one element selected from the group consisting of tungsten, tantalum, niobium, carbon, osmium, iridium, molybdenum or ruthenium.

12. The method according to claim 1, wherein the deposited film is deposited on an inner surface structure of the chamber.

* * * * *